(12) United States Patent
Ebina et al.

(10) Patent No.: US 9,228,113 B2
(45) Date of Patent: Jan. 5, 2016

(54) WATER VAPOR BARRIER FILM AND METHOD FOR PRODUCING SAME

(75) Inventors: Takeo Ebina, Sendai (JP); Shinichi Iwata, Shibata-gun (JP); Nobuhiko Teshima, Osaka (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 448 days.

(21) Appl. No.: 13/701,602

(22) PCT Filed: Jun. 2, 2011

(86) PCT No.: PCT/JP2011/062735
§ 371 (c)(1),
(2), (4) Date: Dec. 3, 2012

(87) PCT Pub. No.: WO2011/152500
PCT Pub. Date: Dec. 8, 2011

(65) Prior Publication Data
US 2013/0071674 A1 Mar. 21, 2013

(30) Foreign Application Priority Data
Jun. 3, 2010 (JP) .................................. 2010-128345

(51) Int. Cl.
*B05D 3/02* (2006.01)
*C09D 179/08* (2006.01)
(Continued)

(52) U.S. Cl.
CPC ............ *C09D 179/08* (2013.01); *B05D 3/0209* (2013.01); *B05D 3/0254* (2013.01);
(Continued)

(58) Field of Classification Search
None
See application file for complete search history.

(56) References Cited

U.S. PATENT DOCUMENTS 7,799,395 B2 9/2010 Ebina et al.
7,898,636 B2 3/2011 Inoue et al.
(Continued)

FOREIGN PATENT DOCUMENTS

CN 101267940 A 9/2008
EP 1 832 553 A1 9/2007
(Continued)

OTHER PUBLICATIONS

Machine translation of JP 2007-277078 A, Oct. 2007.*
(Continued)

*Primary Examiner* — Ramsey Zacharia
(74) *Attorney, Agent, or Firm* — Oblon, McClelland, Maier & Neustadt, L.L.P.

(57) ABSTRACT

The present invention provides a film for a back sheet of a solar cell exhibiting excellent water vapor barrier properties, water resistance and gas barrier properties, has flexibility and mechanical strength and has excellent heat stability, and a method for producing the film.
The present invention is a water vapor barrier film comprising a clay membrane coated on a PET substrate, wherein the clay membrane is formed of clay and an additive; the weight ratio of the clay relative to the total sold is 60 to 90% by weight in the clay membrane; the production process thereof comprises a water resistance imparting heat treatment at 100 to 200° C. after the coating and drying; the film has a water vapor transmission rate of less than 3 g/m$^2$·day; the additive in the modified clay is a polyimide; and at least 90% by mole of exchangeable ions is lithium ion, and a method for producing the water vapor barrier film.
The above film exhibits water vapor barrier properties and is useful as a back sheet for a solar cell and the like.

4 Claims, 2 Drawing Sheets

(51) Int. Cl.
 *C08K 3/34* (2006.01)
 *H01L 31/18* (2006.01)
 *H01L 31/049* (2014.01)

(52) U.S. Cl.
 CPC ............ *C08K 3/346* (2013.01); *H01L 31/049* (2014.12); *H01L 31/18* (2013.01); *B05D 2201/02* (2013.01); *C08J 2367/02* (2013.01); *C08J 2479/08* (2013.01); *C08K 2201/008* (2013.01); *Y02E 10/50* (2013.01)

(56) References Cited

U.S. PATENT DOCUMENTS

| | | | |
|---|---|---|---|
| 7,981,500 | B2 | 7/2011 | Yonemoto et al. |
| 8,007,895 | B2 | 8/2011 | Ebina et al. |
| 8,178,194 | B2 | 5/2012 | Ebina et al. |
| 8,197,741 | B2 | 6/2012 | Tsuda et al. |
| 8,206,814 | B2 | 6/2012 | Ebina et al. |
| 8,647,744 | B2 | 2/2014 | Ebina et al. |
| 2014/0154490 | A1 | 6/2014 | Bando et al. |
| 2014/0221548 | A1 | 8/2014 | Ebina et al. |
| 2014/0251426 | A1 | 9/2014 | Bando et al. |

FOREIGN PATENT DOCUMENTS

| | | |
|---|---|---|
| JP | 05 254824 | 10/1993 |
| JP | 06 095290 | 4/1994 |
| JP | 07 251489 | 10/1995 |
| JP | 10 231434 | 9/1998 |
| JP | 10-231434 A | 9/1998 |
| JP | 2002 030255 | 1/2002 |
| JP | 2005 110550 | 4/2005 |
| JP | 2006 159865 | 6/2006 |
| JP | 2007-83573 A | 4/2007 |
| JP | 2007-240643 A | 9/2007 |
| JP | 2007 277078 | 10/2007 |
| JP | 2007-277078 A | 10/2007 |

OTHER PUBLICATIONS

Onikata, M., Smectite, vol. 8, No. 2, pp. 8 to 13, (1998) (with partial English translation).

Onikata, M., "Properties of Organophilic Bentonite and Future Prospects," Smectite, vol. 13, No. 1, pp. 2 to 15, (May 2003) (with English translation).

Umemura, Y., "Preparation of Methylene Blue-Clay Hybrid Films by a Modified Langmuir-Blodgett Method and Molecular Orientation of Methylene Blue in the Film," Journal of the Clay Science Society of Japan, vol. 42, No. 4, pp. 218 to 222, (2003) (with English abstract).

International Search Report Issued Sep. 13, 2011 in PCT/JP11/62735 Filed Jun. 2, 2011.

Combined Chinese Office Action and Search Report issued Apr. 3, 2014, in Chinese Patent Application No. 201180027256.6 with English translation of category of cited documents.

* cited by examiner

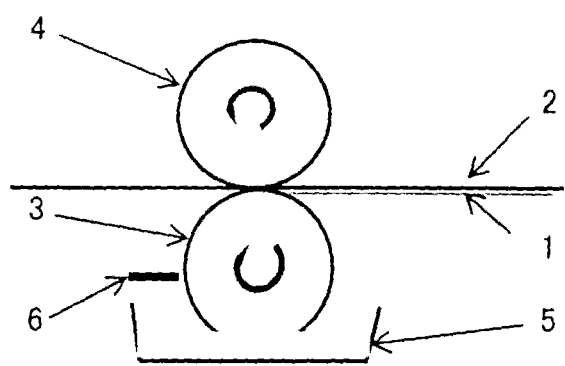
F I G. 2

WATER VAPOR BARRIER FILM AND METHOD FOR PRODUCING SAME

TECHNICAL FIELD

The present invention relates to a back sheet which is arranged and used on the back side of solar cell modules, more specifically, to a film for a back sheet of a solar cell which is obtained by applying clay on a substrate of polyethylene terephthalate (PET) and which exhibits water vapor barrier properties and gas barrier properties, has excellent mechanical strength and heat resistance as well as excellent productivity and quality, and to a method for producing the film.

The present invention is to provide new technologies and new products relating to a novel water vapor barrier film which has excellent weather resistance; can satisfy all the requirements in water vapor barrier properties, gas barrier properties, flexibility, heat resistance, electrical insulation properties and water resistance; has advantages such that it is easy to handle compared to conventional clay membranes and that it can be continuously produced in a roll-to-roll system; and can be suitably used for, in addition to back sheets of solar cells, substrates or protective films for electronic devices such as substrate films for LCDs or films for LEDs.

BACKGROUND ART

Solar cell modules comprise several tens of solar cells which are electrically arranged in tandem or parallel and are provided with a protective package to make them into a unit. Generally, solar cell modules have a structure in which the surface facing to sunlight is covered with a transparent glass or film, solar cells are encapsulated with a filler comprising a light transmissive ethylene-vinyl acetate copolymer resin (EVA) as amain component, and the back side thereof is protected with a laminated sheet (back sheet) formed with a weather resistant plastic material and a metal thin membrane.

The solar cell modules, as they are used outdoors and always exposed to sunlight, i.e., they are exposed to harsh conditions, are required to have sufficient durability in terms of the quality of materials and structures. Among others, back sheets are required, in order to prevent detachment of a filler, discoloration or corrosion of wirings, to have weather resistance (resistance to ultraviolet, moisture resistance, heat resistance, salt damage resistance etc.), water vapor barrier properties, electrical insulation properties, mechanical strength, chemical resistance, compatibility to be adhered and unified with the filler and the like. Particularly, it is required that they can prevent penetration of water, oxygen gas etc., have minimum degradation of the performance for a prolonged period of time, have high durability and are safe and low in cost.

Recently, thin-film solar cells are attracting attention in order to reduce cost and increase efficiency of solar cells, and among others, thin-film silicon solar cells such as of amorphous silicon and crystalline silicon are in practical use. Moreover, flexible solar cells such as CdTe (cadmium telluride), CIS/CIGS (copper indium selenide/copper indium gallium selenide) are also under development for practical application. Flexible solar cells are lightweight and have preferable processability, so that they have wide applications such as for terrestrial type, roof top type, building integrated type as well as for home electronics and for in-vehicle system, for which the market is expected to grow dramatically. Protective packages are required to have weather resistance and flexibility, and technical challenges are to improve their properties.

It has been studied to use resin films such as acrylic resins, polyolefin resins, polyvinyl chloride resins, fluororesins and polyester resins as back sheets. However, only the single film does not meet the requirements in various properties such as weather resistance, heat resistance, moisture proof properties and the like. For example, PET films which are low in cost and versatile and have excellent mechanical strength have a water vapor transmission rate of 14.4 $g/m^2 \cdot day$ (comparative data from Example 1 of the present application), which is not tolerable for long-term use under outdoor environment. There is a need for obtaining a film which can be used as a protective film or back sheet of devices that are used under harsh conditions, e.g., solar cell modules, under severer conditions than conventional materials. Flexible solar cell modules are further required to have mechanical strength such as flexibility, bending properties, etc.

Most of the conventional back sheets having excellent flexibility, water vapor barrier properties and gas barrier properties have been prepared by a method in which a resin film substrate is provided with a barrier layer(s) on one or both sides thereof. Barrier layer of aluminum oxide, silicon oxide, silicon nitride or the like is formed by various methods such as CVD or PVD method. However, water vapor barrier properties and gas barrier properties of the thus formed barrier layers are not always perfect. Because heat resistance depends on the heatproof temperature of a resin, it has been required to use inorganic sheets or metal sheets as gas barrier materials having higher heatproof resistance.

Inorganic sheets are obtained by processing natural or synthetic minerals such as mica or vermiculite into the form of a sheet and have high heat resistance. Although they are used at least for gas sealing members such as gland packings, they are not densely molded and thus cannot completely block the paths where minute molecules of gas flow, thereby having rather low gas barrier properties. Although metal sheets have excellent gas barrier properties, their applications are limited because they have drawbacks in weather resistance, electrical insulation properties, chemical resistance etc.

Various organic polymer materials are used and incorporated to molding materials as a gas barrier material, as well as to inorganic materials as a dispersant, thickener or binder. For example, it has been known that a membrane which is formed with a composition comprising 100 parts by weight of a mixture of (A) a carboxyl-containing resin having hydrogen bonding tendency and having two or more carboxyl groups in a molecule such as polyacrylic acid and (B) a hydroxyl-containing resin having hydrogen bonding tendency and having two or more hydroxyl groups in a molecular chain such as starch in the weight ratio of A/B=80/20 to 60/40 and 1 to 100 parts by weight of an inorganic layered compound such as clay mineral and which has a thickness of 0.1 to 50 µm has gas barrier properties after heat treatment and electron beam treatment (see Patent Document 1). However, in this case, a main component is the additive resin and heat resistance depends on the properties of the polymer organic material.

Laminated films having excellent moisture proof properties and gas barrier properties so as to be applicable for food packages and the like can be obtained by laminating, between two polyolefin resin layers, a layer formed with a resin composition comprising an inorganic layered compound and a resin (see Patent Document 2). Heat resistance of this type of laminated membranes depends on the organic material having the lowest heat resistance among the materials contained, which is in this case polyolefin, and therefore this type of material cannot generally have high heat resistance.

For the purpose of improving heat resistance and gas barrier properties of organic polymers or resins, various clays such as smectite, mica, talc, vermiculite, etc. are added as a filler to resins and their effects have been validated. However, smectite, which has high water dispersibility, is hydrophilic and therefore have low affinity to hydrophobic resins, making it difficult to disperse and incorporate smectite itself at a high amount in resins. Therefore, in order to incorporate it into hydrophobic resins, clays are modified and used in order to control hydrophilicity/hydrophobicity thereof (see Non-patent Document 1).

One of the methods for producing modified clay is ion exchange by a quaternary ammonium cation or quaternary phosphonium cation. Hydrophilicity/hydrophobicity can be controlled by controlling the type and proportion of these organic cations introduced (see Non-patent Document 2). Another method is silylation. Because clay crystals contain hydroxyl groups at the terminals, the hydroxyl groups react with a silylating agent added to make the terminals hydrophobic. In this case again, hydrophilicity/hydrophobicity can be controlled by controlling the type and proportion of the silylating agent introduced. These two modification methods may be used in combination.

Various methods for forming membranes of clay have been reported including a method for preparing an inorganic layered compound thin membrane based on the Langmuir-Blodgett method (see, for example, Non-patent Document 3) and a method for preparing a functional inorganic layered compound thin membrane and the like. Various examples are known such as a method for producing a clay thin membrane by forming a membrane from an aqueous dispersion of a hydrotalcite intercalation compound and drying the same (see Patent Document 3), a method for producing a clay mineral thin membrane having the oriented and fixed binding structure of the clay mineral by utilizing the reaction between the clay mineral and phosphoric acid or a phosphate group and facilitating the reaction by applying heat (see Patent Document 4), an aqueous composition for membrane treatment comprising a smectite type clay mineral and a complex compound of bi- or multivalent metal (see Patent Document 5).

However, in any of those conventional methods, an inorganic layered compound-containing free standing oriented membrane has not been obtained which has mechanical strength sufficient to be used as a free standing membrane and is imparted with gas barrier properties by highly orienting the layers of clay particles. The present inventors invented and suggested a basic method for preparing a free standing clay membrane by simple means as described below (see, for example, Patent Document 6).

(1) Clay particles are dispersed in a liquid dispersion medium to prepare a homogeneous clay dispersion.
(2) The dispersion is poured in a tray or the like and left to precipitate clay particles, and the liquid dispersion medium is separated by a solid-liquid separating means to form a clay membrane.
(3) The clay membrane is optionally dried under the temperature conditions of 110 to 300° C. to obtain a free standing clay membrane.

The present inventors have proposed, in the fields of packages, sealants, electrical insulating materials and the like, a material formed of a modified clay membrane which has gas barrier properties, water vapor barrier properties as well as water resistance and has mechanical strength sufficient to be used as a free standing membrane by adding to a main component of a modified clay a small amount of an additive (Patent Document 7). However, this modified clay membrane has not been in fact in practical use in the fields of solar cells and electronic devices such as displays, fuel cells and the like because further gas barrier properties and water vapor properties, flexibility and mechanical strength, high heat resistance, water resistance and weather resistance are required.

Patent Document 1: Japanese Patent Application Laid-open No. H10-231434
Patent Document 2: Japanese Patent Application Laid-open No. H7-251489
Patent Document 3: Japanese Patent Application Laid-open No. H6-95290
Patent Document 4: Japanese Patent Application Laid-open No. H5-254824
Patent Document 5: Japanese Patent Application Laid-open No. 2002-30255
Patent Document 6: Japanese Patent Application Laid-open No. 2005-110550
Patent Document 7: Japanese Patent Application Laid-open No. 2007-277078
Non-patent Document 1: Masanobu Onigata, SMECTITE, vol. 8, No. 2, p. 8-13 (1998)
Non-patent Document 2: Masanobu Onigata, SMECTITE, vol. 13, No. 1, p. 2-15 (2003)
Non-patent Document 3: Yasushi Umemura, Journal of the Clay Science Society of Japan, vol. 42, No. 4, p. 218-222 (2003)

Under these circumstances with the forgoing in view, the present inventors have carried out extensive studies aiming to develop a new water vapor barrier film utilizing a clay membrane which satisfies the requirements in the improved gas barrier properties and water barrier properties, flexibility and mechanical strength, high heat resistance, water resistance and weather resistance, as described above, and can be put into practical use in the fields of solar cells and electronic devices such as displays, fuel cells and the like and as a result, have found a preferable modified clay by improving the previously developed modified clay and a suitable additive to be added thereto; preferable mixing ratio of the modified clay and the additive; preferable solid-liquid ratio of a dispersion; preferable dispersion method and the like. The present inventors have also found that a laminated product obtained by applying the modified clay paste on a resin film can significantly improve water vapor barrier properties and gas barrier properties of the resin film and increase adhesiveness between the resin film and the clay membrane, and thus completed the present invention.

DISCLOSURE OF THE INVENTION

An object of the present invention is to provide a water vapor barrier film for a back sheet of a solar cell which is obtained by applying modified clay on a resin film in order to orient clay crystals and obtain dense lamination and has flexibility and mechanical strength as well as excellent thermal stability and has improved water vapor barrier properties, water resistance and gas barrier properties and a method for producing the film.

The present invention which can solve the above object comprises the following technical means.
(1) A laminated film exhibiting water vapor barrier properties which comprises a clay membrane coated and dried on a resin film substrate, wherein:
 1) the clay membrane is formed of a clay and an additive consisting of a thermoplastic or thermosetting resin;
 2) a weight ratio of a clay relative to the total sold in the clay membrane is 60 to 90% by weight;

3) a water resistance imparting heat treatment is performed after coating and drying of the clay membrane on the resin film, and wherein the film has an oxygen gas transmission coefficient at a room temperature of less than $4.0 \times 10^{-15}$ $cm^2 s^{-1}$ $cmHg^{-1}$, volume resistivity in the perpendicular direction of the film of 10 MΩ or more and a water vapor transmission rate of less than 3 g/m²·day (test method: Dish method, test period: 140 hr).

(2) The water vapor barrier film according to above (1), wherein the clay is purified bentonite or synthetic smectite and at least 90% by mole of intercalating exchangeable ions of the clay is lithium ion.

(3) The water vapor barrier film according to above (1), wherein the additive is a polyimide.

(4) The water vapor barrier film according to above (1), wherein the resin film is made of polyethylene terephthalate (PET).

(5) A method for producing the laminated film exhibiting water vapor barrier properties according to any one of above (1) to (4), the method comprises applying a clay paste prepared from a clay, an additive consisting of a thermoplastic or thermosetting resin and a dispersion medium as a solvent on a resin film having a flat surface, drying the same, removing the dispersion medium, and performing a water resistance imparting heat treatment, wherein 1) the clay has lithium ion which is at least 90% by mole of intercalating exchangeable ions;

2) a weight ratio of a clay relative in the clay membrane to the total sold is 60 to 90% by weight; and 3) a temperature condition of the water resistance imparting heat treatment is 100 to 200° C.

(6) The method for producing the water vapor barrier film according to above (5), wherein the clay is natural or synthetic clay and is obtained by adding a silylating agent to a starting clay.

(7) The method for producing the water vapor barrier film according to above (5), wherein the resin film is made of polyethylene terephthalate (PET).

(8) The method for producing the water vapor barrier film according to above (5), wherein the film is flexible, has excellent bending properties and can be continuously produced by a roll-to-roll system.

(9) A back sheet of a solar cell containing the water vapor barrier film according to any one of above (1) to (4).

The present invention is further described in detail hereinbelow.

The present invention is a film having water vapor barrier properties comprising a clay membrane coated and dried on a resin film substrate, characterized in that the clay membrane is formed of clay and an additive containing a thermoplastic or thermosetting resin; the weight ratio of the clay relative to the total sold is 60 to 90% by weight in the clay membrane; after applying and drying, a water resistance imparting heat treatment is provided, and the film has an oxygen gas transmission coefficient at a room temperature of less than $4.0 \times 10^{-15}$ $cm^2 s^{-1} cmHg^{-1}$, volume resistivity in the perpendicular direction of the membrane of 10 MΩ or more and a water vapor transmission rate of 3 g/m²·day (test method: Dish method, test period: 140 hr).

The present invention is also a method for producing the water vapor barrier film comprising applying a clay paste prepared from clay, a thermoplastic or thermosetting additive and a dispersion medium on a resin film having a flat surface, drying the paste, removing the dispersion medium which is a solvent and providing a water resistance imparting heat treatment, characterized in that the clay has lithium ion which is at least 90% by mole of intercalating exchangeable ions; the weight ratio of the clay relative to the total sold is 60 to 90% by weight in the clay membrane; and a temperature condition of the water resistance imparting heat treatment is 100 to 200° C.

The water vapor barrier film of the present invention is a laminated film obtained by applying a modified clay on a resin film, which has water vapor barrier properties, has a water vapor transmission rate of less than 3 g/m²·day at 40° C. and relative humidity of 90% (JIS Z0208-1976, Dish method), has heat resistance, is flexible and can be continuously produced with high efficiency.

According to the present invention, clay which is modified by silylation for imparting hydrophobicity and organic cation exchange for high water resistance or lithium ion exchange or the combination thereof and a small amount of an additive having high water resistance are dispersed in a solvent to obtain a homogeneous clay paste without lumps, the clay paste is then coated on a resin film having a flat surface and dried, the solvent which is a dispersion medium is removed to prepare a laminated film and then the film is subjected to a water resistance imparting heat treatment at a higher temperature than the application and drying temperatures. Accordingly, the water vapor barrier film having high water resistance, is flexible, has excellent gas barrier properties and also has high heat resistance can be obtained.

The clay used in the present invention may be exemplified by natural or synthetic clay, for example, one or more of beidellite, nontronite, saponite, hectorite, stevensite and montmorillonite which belong to smectite according to their crystal structures and properties and suitably purified bentonite or synthetic smectite. Purified bentonite is natural clay having a high smectite content. In the present invention, an example of the clay is the one obtained after reaction of clay with a silylating agent. In this case, the amount of the silylating agent relative to the total weight of the clay and the silylating agent is less than 30% by weight.

The silylating agent contained in the clay of the present invention may be exemplified by, but not limited to, methyltrimethoxysilane, methyltriethoxysilane, propyltrimethoxysilane, butyltrimethoxysilane, hexyltrimethoxysilane, octyltrimethoxysilane, dodecyltrimethoxysilane, octadecyltrimethoxysilane. The silylating agent can be introduced in clay by, for example, mixing a starting clay with about 2% by weight of the silylating agent relative to the starting clay and milling them by a ball mill for about 1 hour.

Various silylating agents for preparation of silylated clay are commercially available including the ones having a reactive functional group such as an epoxy, acrylic, amino, or halogen group. The silylated clay prepared with such a silylating agent having a reactive terminal has a reactive terminal and allows various chemical reactions to occur.

Namely, it is possible to improve light permeability, gas barrier properties, water vapor barrier properties or mechanical strength by generating new chemical bond (s) by allowing chemical reactions such as addition, condensation or polymerization reaction to occur by means of treatment during or after membrane formation. Particularly, when the silylated clay has an epoxy terminal, it is possible to form covalent bonds among clay by the epoxy reaction by treatment during or after membrane formation.

As described above, silylated clay can be prepared which have various different reactive terminals. Therefore, it is possible to mix a silylated clay A having a reactive terminal and a silylated clay B having a different reactive terminal, form a membrane from these starting materials and form a chemical bond between these reactive terminals of the clays A and B by treatment during or after membrane formation. Accordingly, light permeability, gas barrier properties, water vapor properties or mechanical strength can be improved.

By lithiating intercalating ions of clay and subjecting the clay to a heat treatment, the intercalating lithium is transferred into a clay octahedral layer and the amount of intercalating ion components is decreased, thereby improving water resistance. This improvement in water resistance notably emerges when 90% by mole or more of the intercalating ionic substances is lithium ion. The heat treatment is generally carried out after membrane formation and has an apparent effect when the temperature condition is about 100° C. or more. The upper limit may be appropriately selected according to the heat resistance of the resin film substrate. The heat treatment time is 20 minutes or more and 24 hours or less. When the temperature is low, the longer treatment period is required.

In the present invention, major plastics may be effective as the additive, including, for example, thermoplastic resins such as commodity plastics e.g., polyethylenes, polypropylenes, polyvinyl chlorides, polystyrenes, ABC resins, PET resins and the like, and so-called engineering plastics e.g., polycarbonates, fluororesins and acetal resins; and thermosetting resins such as phenolic resins, melamine resins, urea resins, polyurethanes, epoxy resins, unsaturated polyesters, polyimides and the like. The additive is preferably, among others, a polyamide or polyimide and suitably a polyimide.

The modified clay used for the present invention has good dispersibility in an organic solvent. The additive and the modified clay, which have affinity to each other, easily bind to each other and make a complex when mixed in an organic solvent. In the present invention, a homogeneous dispersion is first prepared by adding the modified clay and the additive to an organic solvent to obtain a clay paste.

The dispersion may be prepared by, for example, dispersing the modified clay and then adding the additive, dispersing the modified clay in a solution containing the additive, simultaneously adding the modified clay and the additive to the dispersion medium to obtain the dispersion, or separately preparing dispersions of the modified clay and the additive and then mixing these dispersions. It is preferred to disperse the modified clay into an organic solvent and then add the additive or to separately prepare dispersions of the modified clay and the additive and mix the dispersions because they are easily dispersed.

In this case, the modified clay is first added to a solvent to prepare a diluted and homogeneous modified clay dispersion. The concentration of the modified clay in this modified clay dispersion is suitably 0.3 to 15% by weight and more preferably 1 to 10% by weight. When the concentration of the modified clay is too low, a prolonged period of time is required for drying, making continuous coating difficult. When, on the other hand, the concentration of the modified clay is too high, the modified clay is not dispersed well to increase production of lumps and make uniform coating difficult, resulting in production of cracks due to shrinkage during drying, rough surfaces, unevenness in membrane thickness and the like.

The dispersion is then optionally degassed. Degassing may be carried out by, for example, vacuuming, heating, centrifugation and the like, among which a method comprising vacuuming is more preferable. The degassed dispersion or a so-called clay paste is then coated on the resin film with a constant thickness. Any coating method can be used without limitation.

Continuous coating may be carried out by die coating, roll coating, bar coating or, from the industrial point of view, by using a gravure coater as schematically shown in FIG. 2. In a small scale, coating may be carried out by casting, wire coating, spin coating and the like. Although it is not necessary, a weather resistant adhesive may be preliminarily anchor-coated on the resin film.

The resin film may include resins such as, but not limited to, acrylic resins, polyolefin resins, polyvinyl chloride resins, fluororesins and polyester resins. It is preferable to use a versatile polyester, PET, for the resin film. The dimension in thickness may be determined according to designed values of solar cell modules and back sheets and therefore are not particularly limited. Generally, the thickness is 5 to 300 μm.

The clay membrane of the present invention having any thickness can be obtained by increasing or decreasing the solid weight of the dispersion. Surface smoothness tends to be improved when the membrane is formed with a low thickness. In addition, there is a problem that a membrane with a high thickness may have decreased flexibility. Therefore, the coating thickness of the clay paste is desirably 0.5 mm or less.

In the present invention, to highly orient the layers of clay particles means that unit structure layers of clay particles (having about 1 nm to 1.5 nm thickness) are stacked so that the layer planes face one direction to provide high periodicity in the direction perpendicular to the layer planes. In order to obtain such an orientation of the clay particles, it is important to coat the diluted and homogeneous clay paste containing the clay and the additive on the resin film, allow slow evaporation of liquid, i.e., the dispersion medium, and form a membrane in which clay particles are densely laminated.

The drying condition of the heat drying may be selected, although it may depend on the type of the solvent used, from the temperature conditions from a room temperature to 90° C. and more preferably 30° C. to 60° C. and the period from about 10 minutes to 24 hours, so that drying or evaporation of the solvent is completed. The water resistance imparting treatment is then carried out under the temperature condition of 100 to 200° C. The time may depend on the treatment temperature and is about 40 hours at 140° C.

The temperature for the water resistance imparting treatment may be determined depending on the heatproof temperature of the resin film. Conventional PETs which are low in cost and versatile have a heatproof temperature at about 140° C. and PET stretch films have a heatproof temperature at about 200° C. The clay membrane on the resin film has a membrane thickness of 3 to 100 μm and suitably 3 to 80 μm, and the obtained water vapor barrier film has, indicative of gas barrier properties, an oxygen gas transmission coefficient at a room temperature of less than $4.0 \times 10^{-15}$ $cm^2 s^{-1}$ $cmHg^{-1}$ and volume resistivity in the perpendicular direction of the film of 10 MΩ or more. The clay membrane can be widely used as an electrical insulating film thanks to the electrical insulating properties thereof.

The water vapor barrier film of the present invention is flexible and has excellent processability. The film of the present invention contains the clay membrane containing a silicate as a main component, has excellent resistance to ultraviolet and radiation and thus is suitable for use as a back sheet of a solar cell. The water vapor barrier film is chemically stable, can maintain water resistance and can be used as flexible packaging materials, sealing materials, insulating materials and the like.

The present invention can provide the following effects.

(1) The water vapor barrier film of the present invention has excellent weather resistance and can satisfy all requirements in water vapor barrier properties, gas barrier properties, flexibility, heat resistance, electrical insulation properties and water resistance.

(2) The water vapor barrier film of the present invention can be suitably used for, in addition to back sheets of solar cells, e.g., substrates or protective films for electronic devices such as substrate films for LCDs or films for LEDs.

(3) The water vapor barrier film of the present invention can also be used for flexible gas sealing materials, packaging materials, sealing materials, electrical insulating materials and the like.

(4) The water vapor barrier film of the present invention can be widely used as a multilayer film by laminating with, for example, metals, plastics, rubbers, paper, ceramics and the like.

BRIEF DESCRIPTION OF THE DRAWINGS

FIG. 2 is a schematic view of a gravure roll coater showing an example of the method for producing the water vapor barrier film of the present invention.

BEST MODE FOR CARRYING OUT THE INVENTION

Figure 1:
FIG. 1 is a schematic section view of a back sheet of a solar cell obtained with the water vapor barrier film of the present invention.

The present invention is specifically described by way of examples hereinbelow, which do not limit the present invention.

EXAMPLE 1

(1) Preparation of Lithium Exchanged Clay

Natural purified bentonite (Kunipia F, Kunimine Industries Co., Ltd.) was completely dried in an oven at 110° C. or more. The obtained bentonite (300 g) was placed in a ball mill pot together with alumina balls. A silylating agent (6 g; Sila-Ace 5330, Chisso Corporation) was added thereto, the inner atmosphere of the pot was replaced with nitrogen gas and ball mill treatment was carried out for 1 hour to obtain silylated clay. The silylating agent used was the one having a terminal amino group.

The silylated clay (24 g) was added to 400 mL of a 0.5N lithium nitrate aqueous solution and they were mixed under shaking to obtain dispersion. The shaking for dispersion was continued for 2 hours to replace intercalating ions of the clay by lithium ion. The dispersion was then centrifuged for solid-liquid separation, and the obtained solid was washed with a mixed solution of 280 g distilled water and 120 g ethanol to remove excess salts. This washing step was repeated twice or more. The obtained product was completely dried in an oven and crushed to obtain lithium exchanged clay.

(2) Preparation of Clay Paste

The lithium exchanged clay (10 g) was placed in a container, added with 90 g of pure water and mixed and kneaded to prepare a lithium exchanged clay pre-gel. The obtained gel was dispersed in dimethylacetamide in a homogenizer (ULTORA TURRAX T50, IKA; with a shaft from the same manufacturer, S50N-G45F).

To an appropriate container containing 350 g of dimethylacetamide and lithium exchanged clay was added 4.76 g of polyimide varnish (U-Varnish A, Ube Industries, Ltd.) while stirring with the homogenizer. A clay paste was obtained after mixing in a mixer in mixing mode at 2000 rpm for 10 minutes and defoaming in defoaming mode at 2200 rpm for 10 minutes. The viscosity was 1.3 to 2.0 Pa·s and the average was 1.4 Pa·s (TVB-22L, Toki Sangyo, Co., Ltd.).

(3) Molding of Clay Membrane on PET

The clay paste was coated on a PET film with a casting knife at a uniform thickness. The coating thickness of the paste was 0.25 mm. The PET film was Toyobo Ester® A4300 (Toyobo Co., Ltd.) having a thickness of 75 μm.

The coated clay membrane with the PET film was placed in a forced aeration oven at a temperature condition of 60° C. and dried overnight to obtain a uniform clay-coated PET film having a clay membrane thickness of 3.5 μm. The obtained clay-coated PET film was placed in an oven and subjected to a heat treatment at 140° C., which was at or lower than a softening point of the PET film, for 40 hours to 216 hours to obtain water vapor barrier films.

(4) Properties of Clay Membrane

The PET film alone and water vapor barrier films subjected to the above heat treatment at 140° C. were measured for the water vapor transmission rate at 40° C. and relative humidity of 90% by the dish method defined by JIS Z0208-1976 with the test period of 140 hr and the results were compared. Upon measurements, the clay membrane layer of the water vapor barrier films was mounted inside of a dish. The measured water vapor transmission rate is shown in Table 1.

TABLE 1

Comparison of water vapor transmission rate ($g/m^2 \cdot day$) of water vapor barrier films (based on Dish method: JIS Z0206-1976, test period: 140 hr)

| Evaluated sample | Heating conditions | | | |
|---|---|---|---|---|
| | No heating | 140° C., 40 hr | 140° C., 112 hr | 140° C., 216 hr |
| (1) PET film | 14.4 | 8.0 | — | — |
| (2) PET/clay membrane | 4.5 | 2.2 | 2.3 | 5.9 |

From the above table, it was found that both of (1) the PET film alone and (2) the water vapor barrier film of PET/clay membrane have decreased water vapor transmission rate after the heat treatment at 140° C. for 40 to 112 hours compared to that of the film without heat treatment. It was also found that water vapor barrier film having a water vapor transmission rate of less than 3 $g/m^2 \cdot day$ can be obtained by forming the laminate structure of (2) PET/clay membrane rather than (1) the PET film alone. However, when the heat treatment time is long, the water vapor transmission rate showed a tendency of increase due to degradation of PET. The oxygen gas transmission coefficient at a room temperature was less than $3.1 \times 10^{-15}$ $cm^2 s^{-1} cmHg^{-1}$ (measured on Gasperm-100, JASCO Corporation).

EXAMPLE 2

In this Example, the PET/clay membrane prepared in Example 1 was measured for a water vapor transmission rate of the water vapor barrier film on a moisture sensor (trade name: L80-5000, Lyssy). The lower and upper spaces separated with a sample film having 50 $cm^2$ were adjusted at relative humidity of 100% and 9.9% or less, respectively. The water vapor transmission rate ($g/m^2 \cdot day$) was calculated from the time required to increase the relative humidity of the upper space of the sample film from 9.9% to 10.1% due to water vapor transmitting through the clay membrane. The results are shown in Table 2.

TABLE 2

| | Water vapor transmission rate (g/m² · day) of 140° C. heat treated products (moisture sensor) |
|---|---|
| Evaluation sample | Heating conditions: 140° C., 40 hr |
| (1) Clay membrane/PET | 1.9 |
| (2) PET/clay membrane | 2.0 |

The water vapor barrier films having sets of films in inverted orders and being subjected to heat treatment at 140° C. for 40 hr had the water vapor transmission rate measured on the moisture sensor of 1.9 and 2.0 (g/m²·day) and these results were in alignment with the value measured with the above Dish method. It was confirmed that the order of the set of films does not make a difference with regard to the water vapor transmission rate.

INDUSTRIAL APPLICABILITY

As described in detail hereinabove, the present invention relates to the water vapor barrier film which has excellent water vapor barrier properties, has water resistance, has excellent gas barrier properties, is flexible and can be used as a multilayer film laminated with films of other materials or fora surface protective film of other materials. According to the present invention, the water vapor barrier film can be provided which has the above features and can be used for back sheets of solar cells and other various products.

The water vapor barrier film of the present invention is useful for electronic device related films such as substrate films for LCDs, substrate films for organic EL, substrate films for electronic paper, sealing films for electronic devices, films for PDPs, films for LEDs, films for IC tags, protective films for solar cells and the like, members for optical communication, flexible films for other electronic devices, substrate films for various functional films, packaging films for food products, packaging films for beverages, packaging films for medicinal products, packaging films for daily products, packaging films for industrial products, packaging films for other various products, multilayer packaging films, antioxidative membranes, anti-corrosion membranes, weather resistant membranes, incombustible membranes, heat resistant membranes, chemical resistant membranes and the like.

EXPLANATION OF REFERENCE NUMERALS

1 Clay membrane
2 Resin film (PET)
3 Coating roll
4 Backup roll
5 Coating liquid (clay paste)
6 Scraping blade

The invention claimed is:

1. A method for producing a water vapor barrier film comprising a laminated film comprising a clay membrane coated and dried on a resin film substrate, the method comprising:
the resin film substrate comprises polyester resin, and the clay membrane is formed of a clay and an additive consisting of a thermoplastic or thermosetting resin;
the clay comprises lithium ion which is at least 90% by mole of intercalating exchangeable ions;
a weight ratio of the clay relative to the total solid is 60 to 90% by weight; and
applying a clay paste prepared from the clay, the additive consisting of the thermoplastic or thermosetting resin, and a dispersion medium as a solvent to the resin film having a flat surface, to form a coated substrate;
drying the coated substrate;
removing the dispersion medium; and
performing a water resistance imparting treatment under a temperature condition of 100 to 200° C. that is determined depending on the heatproof temperature of the resin film substrate to form the laminated film, and
wherein the laminate film has an oxygen gas transmission coefficient at a room temperature of less than $4.0 \times 10^{-15}$ $cm^2 s^{-1} cmHg^{-1}$, a volume resistivity in the perpendicular direction of 10 MΩ or more, and a water vapor transmission rate of less than 3 g/m²·day (test method: Dish method, test period: 140 hr).

2. The method according to claim 1, wherein the clay is natural or synthetic clay and is obtained by adding a silylating agent to a starting clay.

3. The method according to claim 1, wherein the resin film substrate comprises a polyethylene terephthalate (PET).

4. The method according to claim 1, wherein the laminated film is flexible, has bending properties, and can be continuously produced by a roll-to-roll system.

* * * * *